US011442331B2

(12) United States Patent
Chin

(10) Patent No.: US 11,442,331 B2
(45) Date of Patent: Sep. 13, 2022

(54) MOBILE COMMUNICATION APPARATUS, OPTICAL ASSEMBLY AND APERTURE MODULE OF OPTICAL ASSEMBLY

(71) Applicant: SILICON TOUCH TECHNOLOGY INC., Hsinchu (TW)

(72) Inventor: Chi-Yuan Chin, Hsinchu (TW)

(73) Assignee: SILICON TOUCH TECHNOLOGY INC., Hsinchu (TW)

( * ) Notice: Subject to any disclaimer, the term of this patent is extended or adjusted under 35 U.S.C. 154(b) by 251 days.

(21) Appl. No.: 16/893,625

(22) Filed: Jun. 5, 2020

(65) Prior Publication Data
US 2021/0026218 A1 Jan. 28, 2021

(30) Foreign Application Priority Data
Jul. 22, 2019 (TW) .................................. 108125829

(51) Int. Cl.
*G02F 1/29* (2006.01)
*H01L 27/146* (2006.01)
*G02F 1/1347* (2006.01)

(52) U.S. Cl.
CPC ............ *G02F 1/29* (2013.01); *G02F 1/13471* (2013.01); *H01L 27/14625* (2013.01)

(58) Field of Classification Search
CPC . G02F 1/29; G02F 1/292; G02F 1/294; G02F 1/1347; G02F 1/13471
See application file for complete search history.

(56) References Cited

U.S. PATENT DOCUMENTS

| 7,699,542 | B2 | 4/2010 | Watanabe et al. |
| 10,345,672 | B2 | 7/2019 | Bruizeman et al. |
| 10,503,042 | B2 | 12/2019 | Clark et al. |
| 2010/0053539 | A1* | 3/2010 | Lin .......................... G02F 1/29 |
| | | | 349/200 |
| 2016/0147091 | A1 | 5/2016 | Christmann et al. |
| 2016/0161664 | A1* | 6/2016 | Ishida .................. G02B 6/0045 |
| | | | 359/230 |

(Continued)

FOREIGN PATENT DOCUMENTS

| CN | 1802600 A | 7/2006 |
| CN | 1812504 A | 8/2006 |

(Continued)

*Primary Examiner* — Edward J Glick
*Assistant Examiner* — David Y Chung
(74) *Attorney, Agent, or Firm* — Li & Cai Intellectual Property (USA) Office

(57) ABSTRACT

A mobile communication apparatus, an optical assembly, and an aperture module thereof are provided. The aperture module includes a first liquid crystal (LC) aperture unit and a second LC aperture unit. The first LC aperture unit includes a first LC layer and two first transparent electrode layers disposed on two sides of the first LC layer. At least one of the first transparent electrode layers has a first opening. The second LC aperture unit includes a second LC layer and two second transparent electrode layers disposed on two sides of the second LC layer. At least one of the second transparent electrode layers has a second opening having a central axis overlapped with that of the first opening. The aperture module is configured to control each of the first switch region and the second switch region to be at a light permeable state or a light shield state.

7 Claims, 14 Drawing Sheets

(56) References Cited

U.S. PATENT DOCUMENTS

2018/0173078 A1* 6/2018 Clark ..................... G02B 7/08

FOREIGN PATENT DOCUMENTS

| CN | 105408815 A | 3/2016 |
|----|-------------|--------|
| EP | 3141947 A1 | 3/2017 |
| TW | 201011350 A | 3/2010 |
| WO | WO 2016024746 A1 | 2/2016 |

* cited by examiner

MOBILE COMMUNICATION APPARATUS, OPTICAL ASSEMBLY AND APERTURE MODULE OF OPTICAL ASSEMBLY

CROSS-REFERENCE TO RELATED PATENT APPLICATION

This application claims the benefit of priority to Taiwan Patent Application No. 108125829, filed on Jul. 22, 2019. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an aperture structure, and more particularly to a mobile communication apparatus, an optical assembly, and an aperture module of an optical assembly.

BACKGROUND OF THE DISCLOSURE

A conventional mobile communication device (e.g. a smart phone or a tablet computer) is provided with a camera device (e.g., a Complementary Metal-Oxide Semiconductor) that does not contain an aperture structure, so that the camera performance of the camera device of the conventional mobile communication apparatus is difficult to be improved. Furthermore, with consideration to the thickness requirements of the conventional mobile communication apparatus, an aperture structure of a conventional camera is difficult to be applied to the camera device of the conventional mobile communication apparatus due to its complex structure.

SUMMARY OF THE DISCLOSURE

In response to the above-referenced technical inadequacies, the present disclosure provides a mobile communication apparatus, an optical assembly, and an aperture module of an optical assembly to effectively improve the issues associated with conventional mobile communication apparatus.

In one aspect, the present disclosure provides a mobile communication apparatus, which includes a display, an image sensor electrically coupled to the display, a lens module corresponding in position to the image sensor and defining an optical axis, and an aperture module that is arranged at the optical axis of the lens module. The lens module and the aperture module are jointly provided for a light to pass there-through and project onto the image sensor, so that the image sensor is configured to emit a signal related to the light to be transmitted to the display. The aperture module includes a first liquid crystal (LC) aperture unit, a second LC aperture unit, and a controlling unit. The first LC aperture unit includes a first LC layer and two first transparent electrode layers. The first LC layer has a first light permeable region and a first switch region that surrounds the first light permeable region. A transmittance of the first light permeable region is greater than or equal to a transmittance of the first switch region. The two first transparent electrode layers are respectively disposed on two opposite sides of the first LC layer. An inner side of each of the two first transparent electrode layers surroundingly defines a first opening that corresponds in position to the first light permeable region. The second LC aperture unit includes a second LC layer and two second transparent electrode layers. The second LC layer has a second light permeable region and a second switch region that surrounds the second light permeable region. A transmittance of the second light permeable region is greater than or equal to a transmittance of the second switch region. The two second transparent electrode layers are respectively disposed on two opposite sides of the second LC layer. An inner side of each of the two second transparent electrode layers surroundingly defines a second opening that corresponds in position to the second light permeable region. An inner diameter of each of the first openings is different from an inner diameter of each of the second openings, and a central axis of each of the first openings and a central axis of each of the second openings are overlapped with the optical axis. The controlling unit is electrically coupled to the two first transparent electrode layers and the two second transparent electrode layers so as to control each of the first switch region and the second switch region to be selectively at a light permeable state and a light shield state. The transmittance of any one of the first switch region and the second switch region at the light shield state is less than that at the light permeable state. The aperture module allows at least one of the first switch region and the second switch region to be selectively at the light shield state by the controlling unit, so that the aperture module is configured to provide an aperture value corresponding to the first opening or the second opening.

In one aspect, the present disclosure provides an optical assembly, which includes a lens module defining an optical axis and an aperture module that is arranged at the optical axis of the lens module. The lens module and the aperture module are jointly provided for a light to pass there-through. The aperture module includes a first liquid crystal (LC) aperture unit, a second LC aperture unit, and a controlling unit. The first LC aperture unit includes a first LC layer and two first transparent electrode layers. The first LC layer has a first light permeable region and a first switch region that is arranged around the first light permeable region. A transmittance of the first light permeable region is greater than or equal to a transmittance of the first switch region. The two first transparent electrode layers are respectively disposed on two opposite sides of the first LC layer. An inner side of at least one of the two first transparent electrode layers surroundingly defines a first opening that corresponds in position to the first light permeable region. The second LC aperture unit includes a second LC layer and two second transparent electrode layers. The second LC layer has a second light permeable region and a second switch region that is arranged around the second light permeable region. A transmittance of the second light permeable region is greater than or equal to a transmittance of the second switch region. The two second transparent electrode layers are respectively disposed on two opposite sides of the second LC layer. An inner side of at least one of the two second transparent electrode layers surroundingly defines a second opening that corresponds in position to the second light permeable region. An inner diameter of the first opening is different from an inner diameter of the second opening, and a central axis of the first opening and a central axis of the second opening are overlapped with the optical axis. The controlling unit is electrically coupled to the two first transparent electrode layers and the two second transparent electrode layers so as to control each of the first switch region and the second switch region to be selectively at a light permeable state and a light shield state. The transmittance of any one of the first switch region and the second switch region at the light shield state is less than that at the light permeable state. The aperture module allows at least one of the first switch region and the second switch region to be selectively at the light shield state by the controlling unit, so that the aperture module is configured to provide an aperture value corresponding to the first opening or the second opening.

In one aspect, the present disclosure provides an aperture module of an optical assembly, which includes a first liquid crystal (LC) aperture unit and a second LC aperture unit. The first LC aperture unit includes a first LC layer and two first transparent electrode layers. The first LC layer has a first light permeable region and a first switch region that is arranged around the first light permeable region. A transmittance of the first light permeable region is greater than or equal to a transmittance of the first switch region. The two first transparent electrode layers are respectively disposed on two opposite sides of the first LC layer. An inner side of at least one of the two first transparent electrode layers surroundingly defines a first opening that corresponds in position to the first light permeable region. The second LC aperture unit includes a second LC layer and two second transparent electrode layers. The second LC layer has a second light permeable region and a second switch region that is arranged around the second light permeable region. A transmittance of the second light permeable region is greater than or equal to a transmittance of the second switch region. The two second transparent electrode layers are respectively disposed on two opposite sides of the second LC layer. An inner side of at least one of the two second transparent electrode layers surroundingly defines a second opening that corresponds in position to the second light permeable region. An inner diameter of the first opening is different from an inner diameter of the second opening, and a central axis of the first opening is overlapped with a central axis of the second opening. The two first transparent electrode layers and the two second transparent electrode layers are configured to electrically couple to a controlling unit so as to control each of the first switch region and the second switch region to be selectively at a light permeable state and a light shield state. The transmittance of any one of the first switch region and the second switch region at the light shield state is less than that at the light permeable state.

Therefore, the first LC aperture unit and the second LC aperture unit of the aperture module in the present disclosure can be used in cooperation with the lens module of the mobile communication apparatus for adjusting the aperture value, thereby effectively increasing the photograph performance of the mobile communication apparatus.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
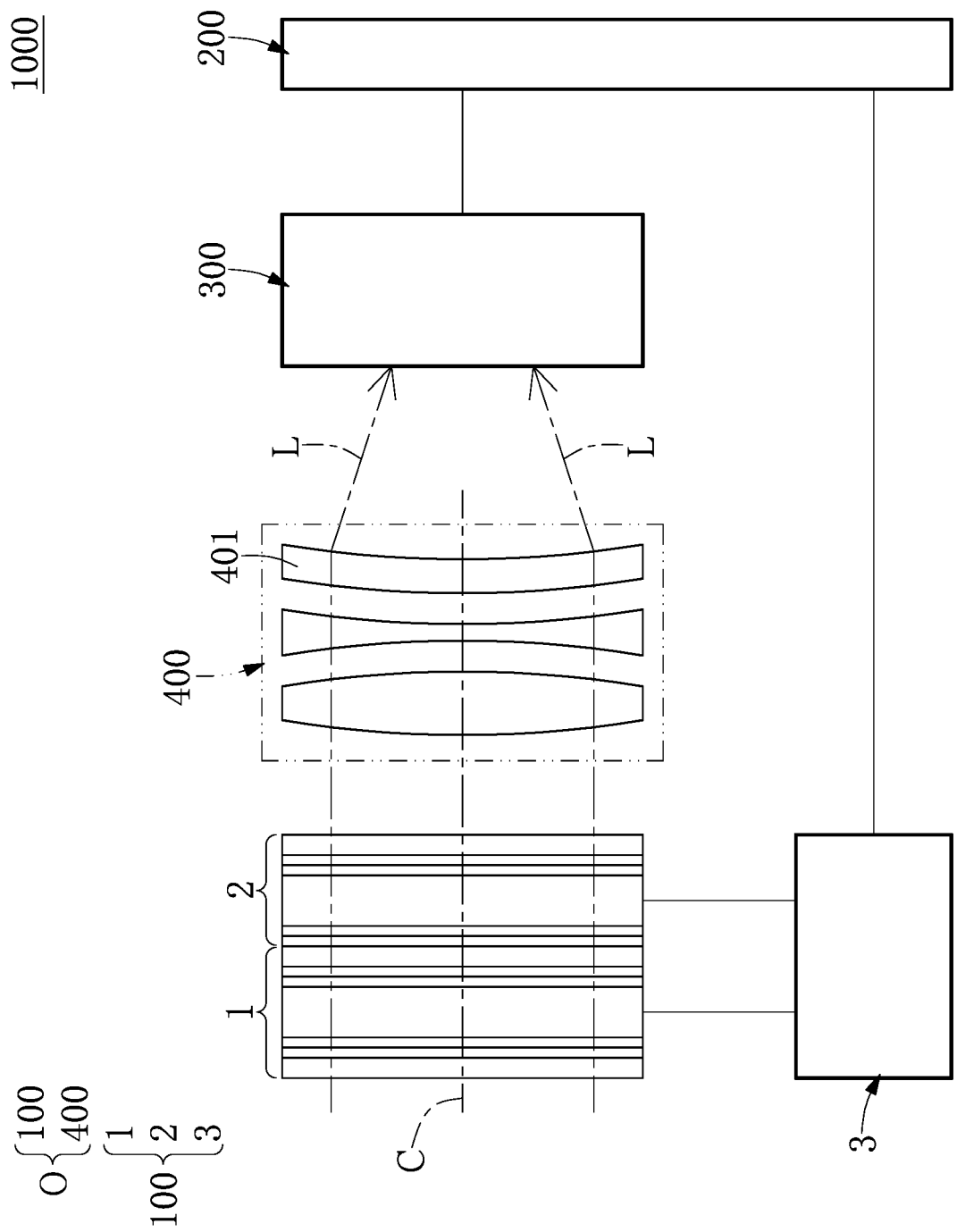
FIG. 1 is a schematic view of a mobile communication apparatus according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 5, a first embodiment of the present disclosure provides a mobile communication apparatus 1000 (e.g., a smart phone or a tablet PC). As shown in FIG. 1, the mobile communication apparatus 1000 includes a display 200, an image sensor 300 electrically coupled to the display 200, a lens module 400 corresponding in position to the image sensor 300, and an aperture module 100 that corresponds in position to the lens module 400 and is electrically coupled to the display 200. The lens module 400 and the aperture module 100 in the present embodiment can be jointly defined as an optical assembly O. However, in other embodiments of the present disclosure, the optical assembly O can be applied to other apparatus.

It should be noted that the display 200 in the present embodiment has a touch-control function, and the operation of the aperture module 100 can be controlled by the touch-control function of the display 200. The lens module 400 can be adjusted to allow the image sensor 300 to easily receive a light L that passes through the lens module 400. In addition, the mobile communication apparatus 1000 described in the present embodiment only includes components related to the optical assembly O, and descriptions of other components of the mobile communication apparatus 1000 will be omitted for the sake of brevity.

The lens module 400 defines an optical axis C, and the lens module 400 in the present embodiment includes a plurality of lenses 401. The lenses 401 can be any combination of at least one convex lens, at least one concave lens, and at least one flat lens, but the present disclosure is not limited thereto. Moreover, axes of the lenses 401 in the present embodiment are overlapped with the optical axis C. In other words, the lenses 401 have the same optical axis.

The aperture module 100 is located at the optical axis C of the lens module 400, and the aperture module 100 in the present embodiment is located at one side of the lens module 400 away from the image sensor 300 (e.g., the left side of the lens module 400 shown in FIG. 1), but the present disclosure is not limited thereto. For example, in other embodiments of the present disclosure, the aperture module 100 can be arranged between the image sensor 300 and the lens module 400.

The lens module 400 and the aperture module 100 are jointly provided or configured for the light L to travel onto the image sensor 300 by passing there-through, so that the image sensor 300 allows a signal related to the light L to be transmitted to the display 200. The following description describes the structure of the lens module 400 in the present disclosure, but the present disclosure is not limited thereto.

The aperture module 100 in the present embodiment includes a first LC aperture unit 1, a second LC aperture unit 2 corresponding in position to the first LC aperture unit 1, and a controlling unit 3 that is electrically coupled to the first LC aperture unit 1 and the second LC aperture unit 2. However, in other embodiments of the present disclosure, the aperture module 100 can be directly and electrically coupled to an electronic device (not shown), thereby omitting the controlling unit 3. In other words, the aperture module 100 can be independently used or can be used in cooperation with other devices.

Figure 2:
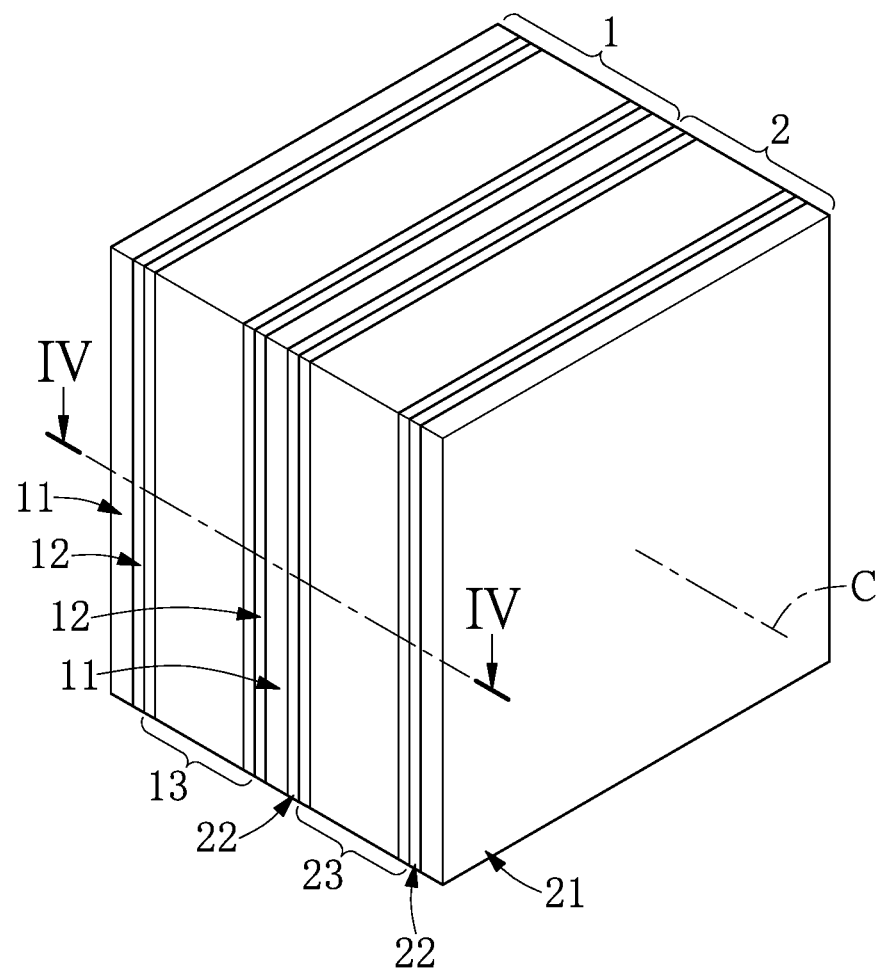
FIG. 2 is a perspective view showing a first liquid crystal (LC) aperture unit and a second LC aperture unit of FIG. 1.
Figure 3:
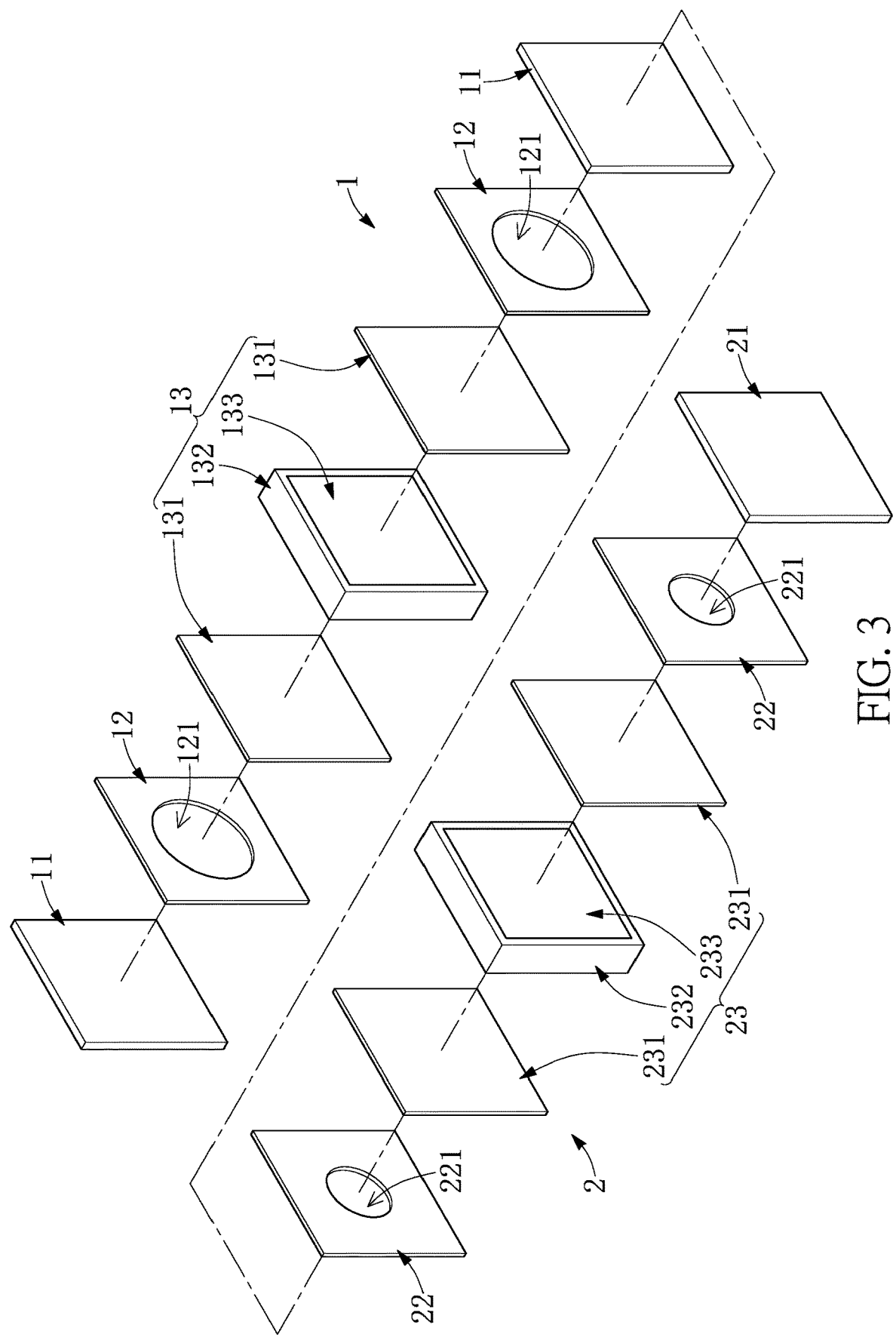
FIG. 3 is an exploded view of FIG. 2.

As shown in FIG. 2 and FIG. 3, the first LC aperture unit 1 in the present embodiment includes two first transparent substrates 11, two first transparent electrode layers 12 respectively formed on the two first transparent substrates 11, and a first LC layer 13 that is arranged between the two first transparent electrode layers 12. That is to say, the two first transparent electrode layers 12 are disposed on two opposite sides of the first LC layer 13, and each of the two first transparent electrode layers 12 is sandwiched between the first LC layer 13 and the corresponding first transparent substrate 11.

Each of the two first transparent substrates 11 in the present embodiment can be a glass board or a transparent plastic board, and the shape of each of the two first transparent substrates 11 can be changed or adjusted according to design requirements, but the present disclosure is not limited thereto.

Each of the two first transparent electrode layers 12 in the present embodiment can be made of a transparent conductive material (e.g., an indium tin oxide, an indium zinc oxide, or an indium gallium zinc oxide), but the present disclosure is not limited thereto. Moreover, an inner side of each of the two first transparent electrode layers 12 surroundingly defines a first opening 121. The first opening 121 of each of the two first transparent electrode layers 12 in the present embodiment is a circular hole, but the present disclosure is not limited thereto. Specifically, the two first openings 121 in the present embodiment have the same inner diameter, central axes of the two first openings 121 are located at the optical axis C, and the first opening 121 of each of the two first transparent electrode layers 12 is provided without any electrode therein.

However, in other embodiments of the present disclosure, one of the two first transparent electrode layers 12 has the first opening 121, but the other one of the two first transparent electrode layers 12 does not have the first opening 121 and substantially covers the entirety of the corresponding first transparent substrate 11.

Figure 4:
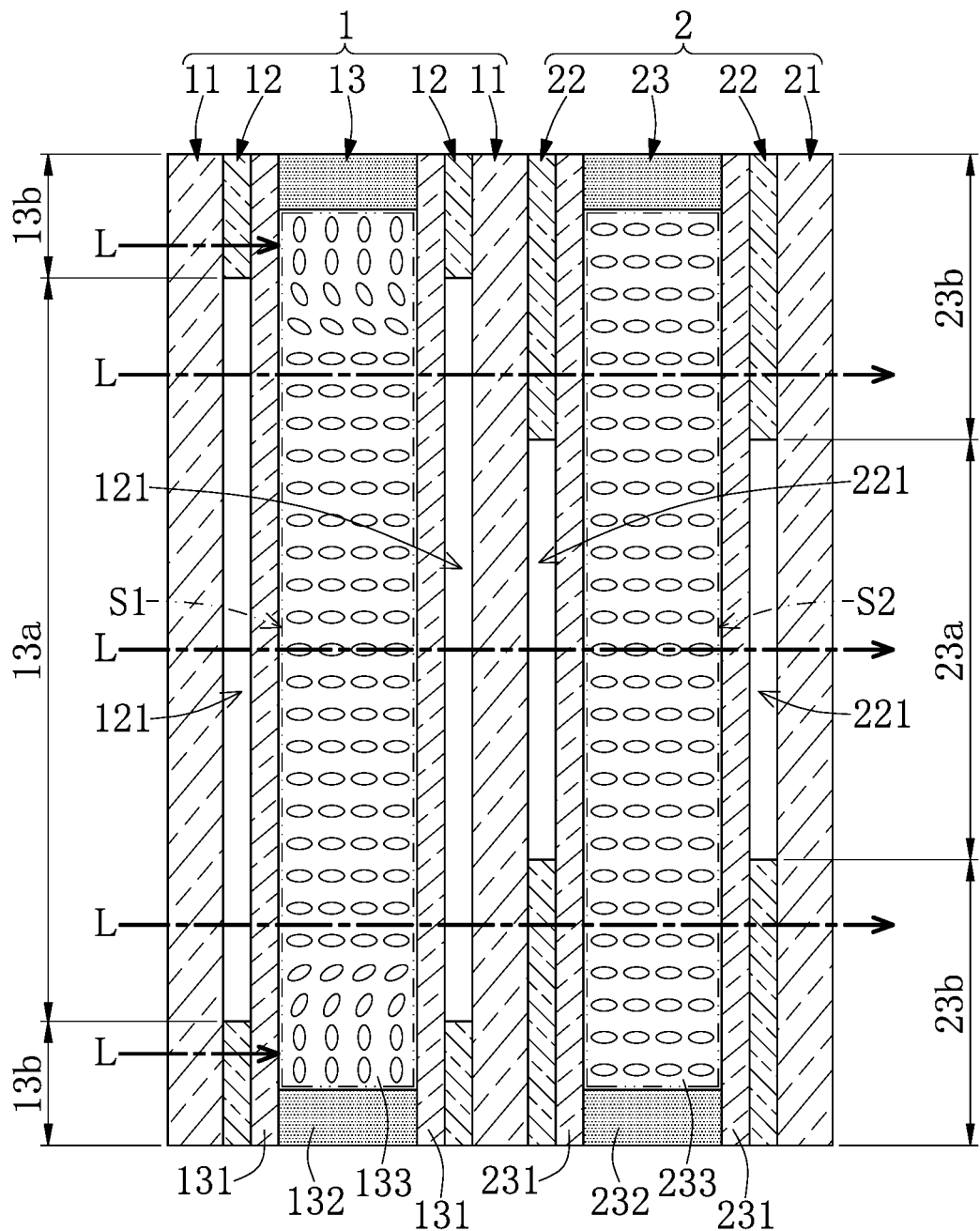
FIG. 4 is a cross-sectional view taken along line IV-IV of FIG. 2 when a first switch region is at a light shield state and a second switch region is at a light permeable state.
Figure 5:
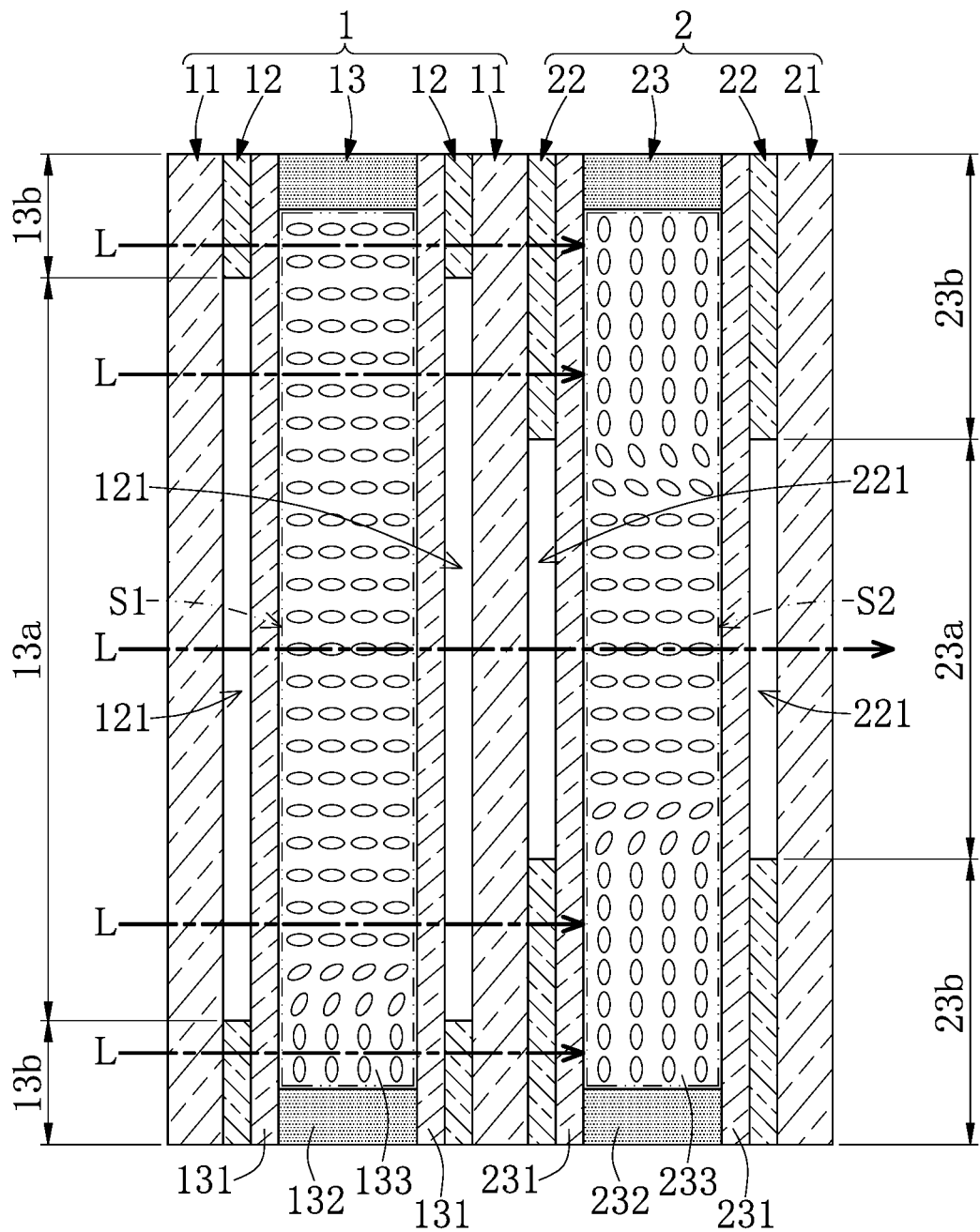
FIG. 5 is a cross-sectional view showing the first LC aperture unit and the second LC aperture unit when the first switch region is at a light permeable state and the second switch region is at a light shield state.

As shown in FIG. 3 to FIG. 5, the first LC layer 13 has (or is divided into) a first light permeable region 13a and a first switch region 13b that surrounds the first light permeable region 13a. Moreover, a transmittance of the first light permeable region 13a is greater than or equal to a transmittance of the first switch region 13b. In the present embodiment, the first light permeable region 13a corresponds in position to the first opening 121 of each of the two first transparent electrode layers 12. Preferably, the shape of the first light permeable region 13a is identical to that of each of the two first openings 121, and an edge of the first light permeable region 13a is flush with the inner side of each of the two first transparent electrode layers 12 along a direction parallel to the optical axis C, but the present disclosure is not limited thereto. For example, in other embodiments of the present disclosure, the size of the first light permeable region 13a can be slightly smaller than or slightly larger than that of each of the two first openings 121.

Specifically, the first LC layer 13 in the present embodiment includes two first orientation layers 131, an outer ring-shaped adhesive 132 connected to inner surfaces of the two first orientation layers 131, and a first LC group 133. The outer ring-shaped adhesive 132 and the two first orientation layers 131 jointly and surroundingly define a first enclosed space S1, and the first LC group 133 is filled within the first enclosed space S1. Moreover, the two first transparent electrode layers 12 are respectively disposed on two outer surfaces of the two first orientation layers 131 that are distant from each other. In other words, any one of the two first orientation layers 131 and the corresponding first transparent substrate 11 adjacent thereto are provided with one of the two first transparent electrode layers 12 there-between.

It should be noted that the first LC group 133 in the present embodiment includes a plurality of LC molecules, and the two first orientation layers 131 are configured to arrange or rotate the LC molecules of the first LC group 133 according to design requirements, so that the LC molecules of the first LC group 133 can be driven to achieve a predetermined deflection effect by the two first orientation layers 131.

Moreover, in the present embodiment, the deflection of the LC molecules of the first LC group 133 arranged in the first switch region 13b can be changed by an electric field between the two first transparent electrode layers 12, so that the first switch region 13b of the first LC layer 13 can be used to block the light L or can be used to allow the light L to pass there-through. In other words, the LC molecules of the first LC group 133 arranged in the first light permeable region 13a are not easily affected by the electric field between the two first transparent electrode layers 12, so that the first light permeable region 13a is used to always allow the light L to pass there-through.

The second LC aperture unit 2 in the present embodiment includes a second transparent substrate 21, two second transparent electrode layers 22, and a second LC layer 23 that is arranged between the two second transparent electrode layers 22. The two second transparent electrode layers 22 are disposed on two opposite sides of the second LC layer 23. One of the two second transparent electrode layers 22 is formed on the second transparent substrate 21 and is sandwiched between the second transparent substrate 21 and the second LC layer 23, and the other one of the two second transparent electrode layers 22 is formed on one of the two first transparent substrates 11 and is sandwiched between the corresponding first transparent substrate 11 and the second LC layer 23.

Specifically, the second LC aperture unit 2 in the present embodiment is directly disposed on or formed onto one of the two first transparent substrates 11 of the first LC aperture unit 1, so that the second LC aperture unit 2 and the first LC aperture unit 1 can share the use of one of the two first transparent substrates 11. Accordingly, the thickness of the aperture module 100 can be effectively reduced for being applied to the mobile communication apparatus 1000 requiring a smaller thickness.

The second transparent substrate 21 in the present embodiment can be a glass board or a transparent plastic board, and the shape of the second transparent substrate 21 can be changed or adjusted according to design requirements, but the present disclosure is not limited thereto.

Each of the two second transparent electrode layers 22 in the present embodiment can be made of a transparent conductive material (e.g., an indium tin oxide, an indium zinc oxide, or an indium gallium zinc oxide), but the present disclosure is not limited thereto. Moreover, an inner side of each of the two second transparent electrode layers 22 surroundingly defines a second opening 221. The second opening 221 of each of the two second transparent electrode layers 22 in the present embodiment is a circular hole, but the present disclosure is not limited thereto.

Specifically, the two second openings 221 in the present embodiment have the same inner diameter, central axes of the two second openings 221 are located at the optical axis C (i.e., the central axis of each of the two first openings 121 overlaps with that of each of the two second openings 221), and the second opening 221 of each of the two second transparent electrode layers 22 is provided without any electrode therein. In addition, the inner diameter of each of the two first openings 121 is different from that of each of the two second openings 221, the inner diameter of each of the two first openings 121 is greater than that of each of the two second openings 221, but the present disclosure is not limited thereto.

However, in other embodiments of the present disclosure, one of the two second transparent electrode layers 22 has the second opening 221, but the other one of the two second transparent electrode layers 22 does not have the second opening 221 and substantially covers the entirety of the corresponding first transparent substrate 11 or the second transparent substrate 21.

The second LC layer 23 has (or is divided into) a second light permeable region 23a and a second switch region 23b that surrounds the second light permeable region 23a. Moreover, a transmittance of the second light permeable region 23a is greater than or equal to a transmittance of the second switch region 23b. In the present embodiment, the second light permeable region 23a corresponds in position to the second opening 221 of each of the two second transparent electrode layers 22. Preferably, the shape of the second light permeable region 23a is identical to that of each of the two second openings 221, and an edge of the second light permeable region 23a is flush with the inner side of each of the two second transparent electrode layer 22 along a direction parallel to the optical axis C, but the present disclosure is not limited thereto. For example, in other embodiments of the present disclosure, the size of the second light permeable region 23a can be slightly smaller than or slightly larger than that of each of the two second openings 221.

Specifically, the second LC layer 23 in the present embodiment includes two second orientation layers 231, an outer ring-shaped adhesive 232 connected to inner surfaces of the two second orientation layers 231, and a second LC group 233. The outer ring-shaped adhesive 232 and the two second orientation layers 231 jointly and surroundingly define a second enclosed space S2, and the second LC group 233 is filled within the second enclosed space S2. Moreover, the two second transparent electrode layers 22 are respectively disposed on two outer surfaces of the two second orientation layer 231 that are distant from each other. In other words, any one of the two second orientation layers 231 and the corresponding first transparent substrate 11 (or the second transparent substrate 21) are provided with one of the two the second transparent electrode layers 22 there-between.

It should be noted that the second LC group 233 in the present embodiment includes a plurality of LC molecules, and the two second orientation layers 231 are configured to arrange or rotate the LC molecules of the second LC group 233 according to design requirements, so that the LC molecules of the second LC group 233 can be driven to achieve a predetermined deflection effect by the two second orientation layers 231.

Moreover, in the present embodiment, the deflection of the LC molecules of the second LC group 233 arranged in the second switch region 23b can be changed by an electric field between the two second transparent electrode layers 22, so that the second switch region 23b of the second LC layer 23 can be used to block the light L or can be used to allow the light L to pass there-through. In other words, the LC molecules of the second LC group 233 arranged in the second light permeable region 23a are not easily affected by the electric field between the two second transparent electrode layers 22, so that the second light permeable region 23a is used to always allow the light L to pass there-through.

As shown in FIG. 1 and FIG. 2, the controlling unit 3 in the present embodiment can be a controller or a control circuit, but the present disclosure is not limited thereto. The controlling unit 3 is electrically coupled to the two first transparent electrode layers 12 and the two second transparent electrode layers 22 so as to control each of the first switch region 13b and the second switch region 23b to be selectively at a light permeable state and a light shield state. In other words, the two first transparent electrode layers 12 and the two second transparent electrode layers 22 can respectively control the first switch region 13b and the second switch region 23b to be selectively at the light permeable state and the light shield state by being electrically coupled to the controlling unit 3.

Specifically, as shown in FIG. 4 and FIG. 5, the transmittance of any one of the first switch region 13b and the second switch region 23b at the light shield state is less than that at the light permeable state. In the present embodiment, the transmittance of any one of the first switch region 13b and the second switch region 23b at the light shield state is less than 50% (e.g., the transmittance is preferably less than 20%), but the present disclosure is not limited thereto.

Moreover, a peripheral portion of the first switch region 13b is located adjacent to and would be affected by the electric field between the two first transparent electrode layers 12, so that when the first switch region 13b is at the light shield state, the transmittance of the first light permeable region 13a gradually increases along a direction that extends away from the first switch region 13b. Similarly, when the second switch region 23b is at the light shield state, the transmittance of the second light permeable region 23a gradually increases along a direction that extends away from the second switch region 23b.

Specifically, the controlling unit 3 can independently provide a voltage to the two first transparent electrode layers 12, so that the two first transparent electrode layers 12 have a predetermined electric field there-between for achieving the deflection of the LC molecules of the first LC group 133 arranged in the first switch region 13b. Similarly, the controlling unit 3 can independently provide a voltage to the two second transparent electrode layers 22, so that the two second transparent electrode layers 22 have a predetermined electric field there-between for achieving the deflection of the LC molecules of the second LC group 233 arranged in the second switch region 23b.

In summary, as shown in FIG. 1 to FIG. 5, the aperture module 100 allows at least one of the first switch region 13b and the second switch region 23b to be selectively at the light shield state by the controlling unit 3, so that the aperture module 100 can provide an aperture value corresponding to the first opening 121 or the second opening 221. Accordingly, the first LC aperture unit 1 and the second LC aperture unit 2 of the aperture module 100 in the present embodiment can be used in cooperation with the lens module 400 of the mobile communication apparatus 1000 for adjusting the aperture value, thereby effectively increasing the photograph performance of the mobile communication apparatus 1000.

For example, as shown in FIG. 2 and FIG. 4, the first switch region 13b is at the light shield state, and the second switch region 23b is at the light permeable state, so that the first opening 121 is taken as an aperture of the aperture module 100. Moreover, as shown in FIG. 2 and FIG. 5, the first switch region 13b is at the light permeable state, and the second switch region 23b is at the light shield state, so that the second opening 221 is taken as an aperture of the aperture module 100. In other embodiments of the present disclosure, when the first switch region 13b and the second switch region 23b are at the light shield state, the aperture module 100 can take the second opening 221 to be an aperture.

However, in other embodiments of the present disclosure, the aperture module 100 can further include at least one LC aperture unit that is similar in structure to the second LC aperture unit 2 and is directly disposed on the second transparent substrate 21 of the second LC aperture unit 2. Specifically, the difference between the at least one LC aperture unit (not shown) and the second LC aperture unit 2 is an inner diameter of opening of transparent electrode of the at least one LC aperture unit (not shown) different from that of the first opening 121 and different from that of the second opening 221.

Second Embodiment

Referring to FIG. 6 to FIG. 10, a second embodiment of the present disclosure is similar to the first embodiment of the present disclosure. For the sake of brevity, descriptions of the same components in the first and second embodiments of the present disclosure will be omitted, and the following description only discloses different features between the first and second embodiments.

Figure 6:
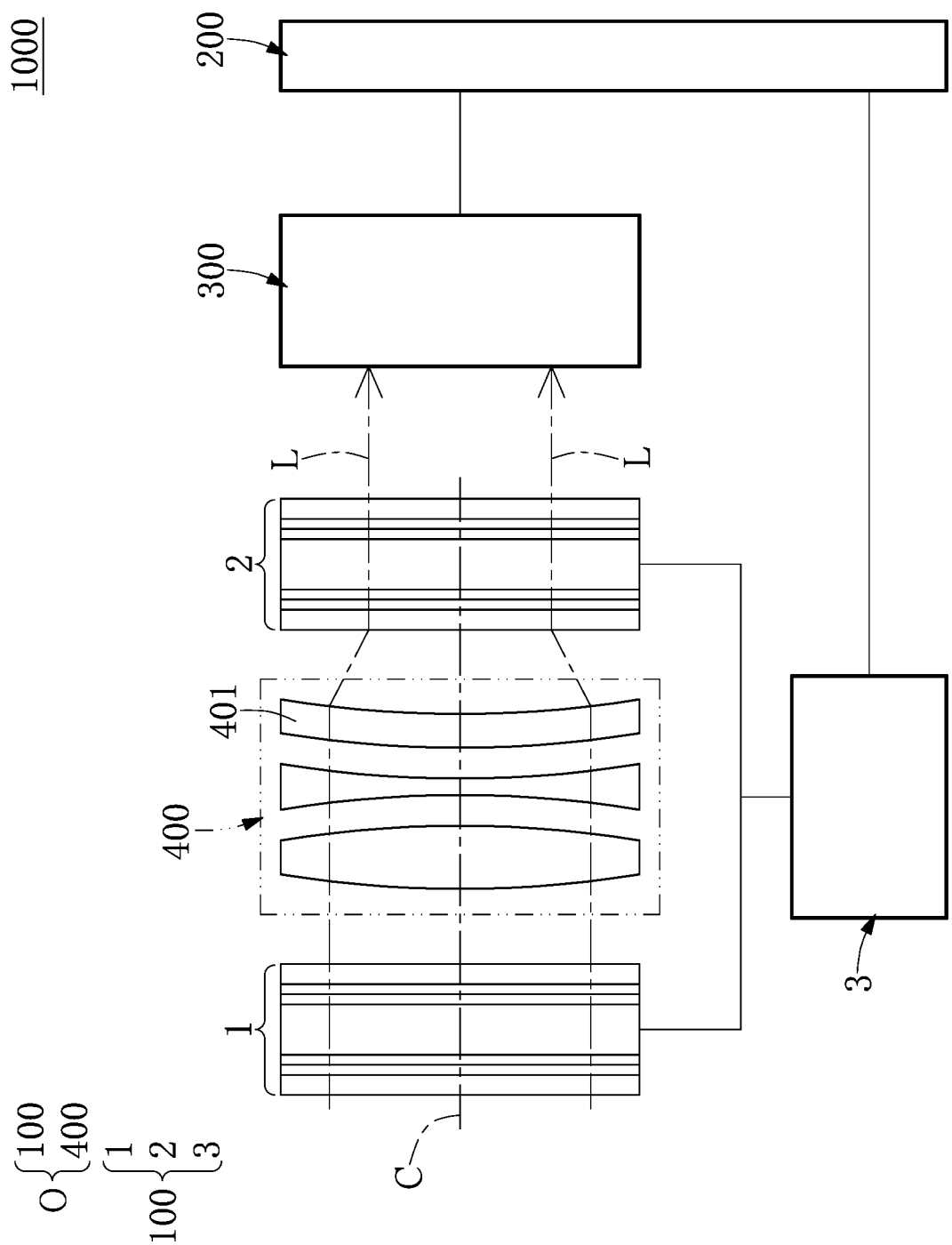
FIG. 6 is a schematic view of a mobile communication apparatus according to a second embodiment of the present disclosure.
Figure 7:
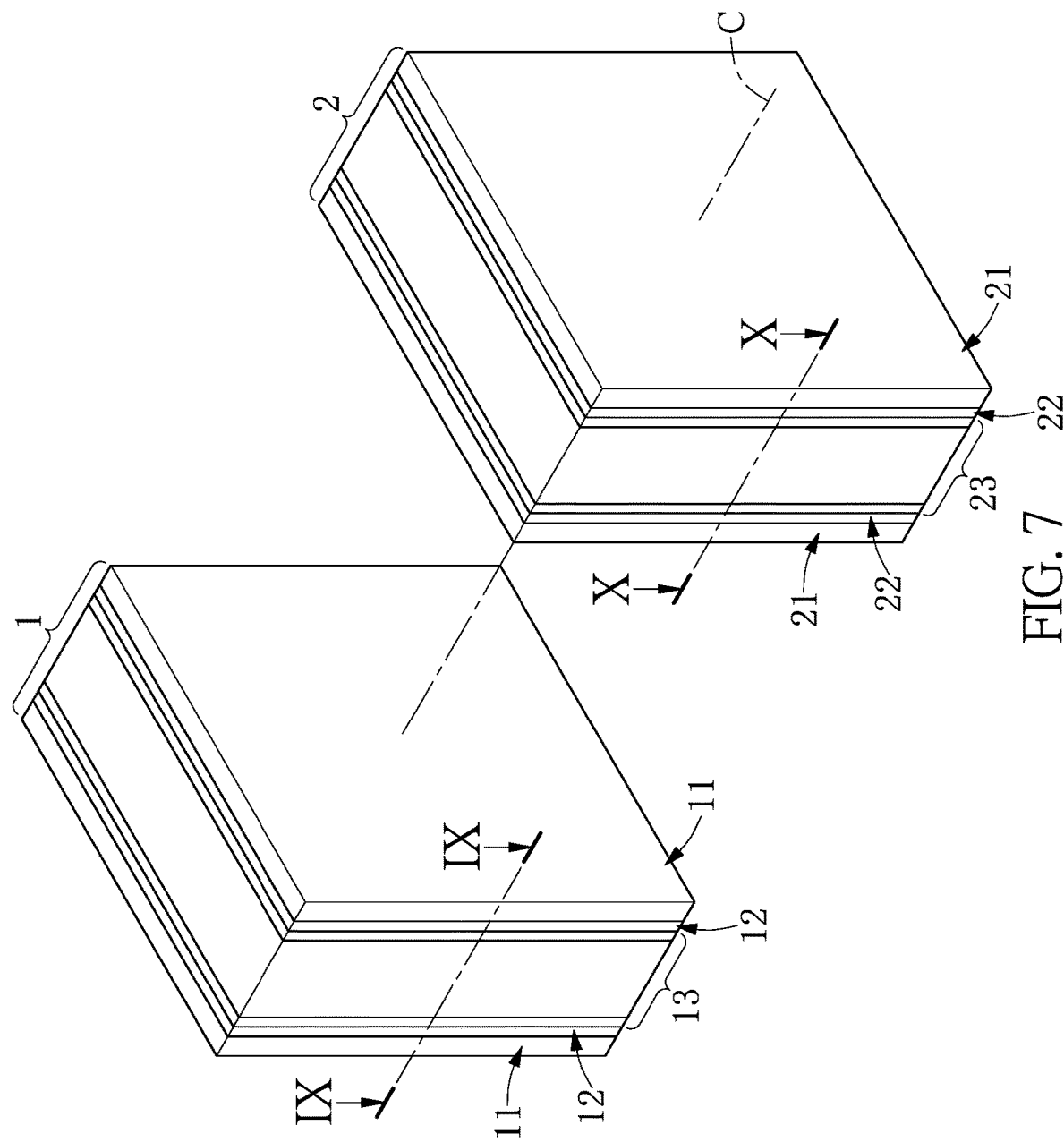
FIG. 7 is a perspective view showing a first liquid crystal (LC) aperture unit and a second LC aperture unit of FIG. 6.

In the present embodiment, as shown in FIG. 6 and FIG. 7, any one of the first LC aperture unit 1 and the second LC aperture unit 2 of the aperture module 100 can be independently used. Moreover, the first LC aperture unit 1 and the second LC aperture unit 2 are arranged at the optical axis C of the lens module 400 and are respectively disposed on two opposite sides of the lens module 400, but the present disclosure is not limited thereto.

Figure 8:
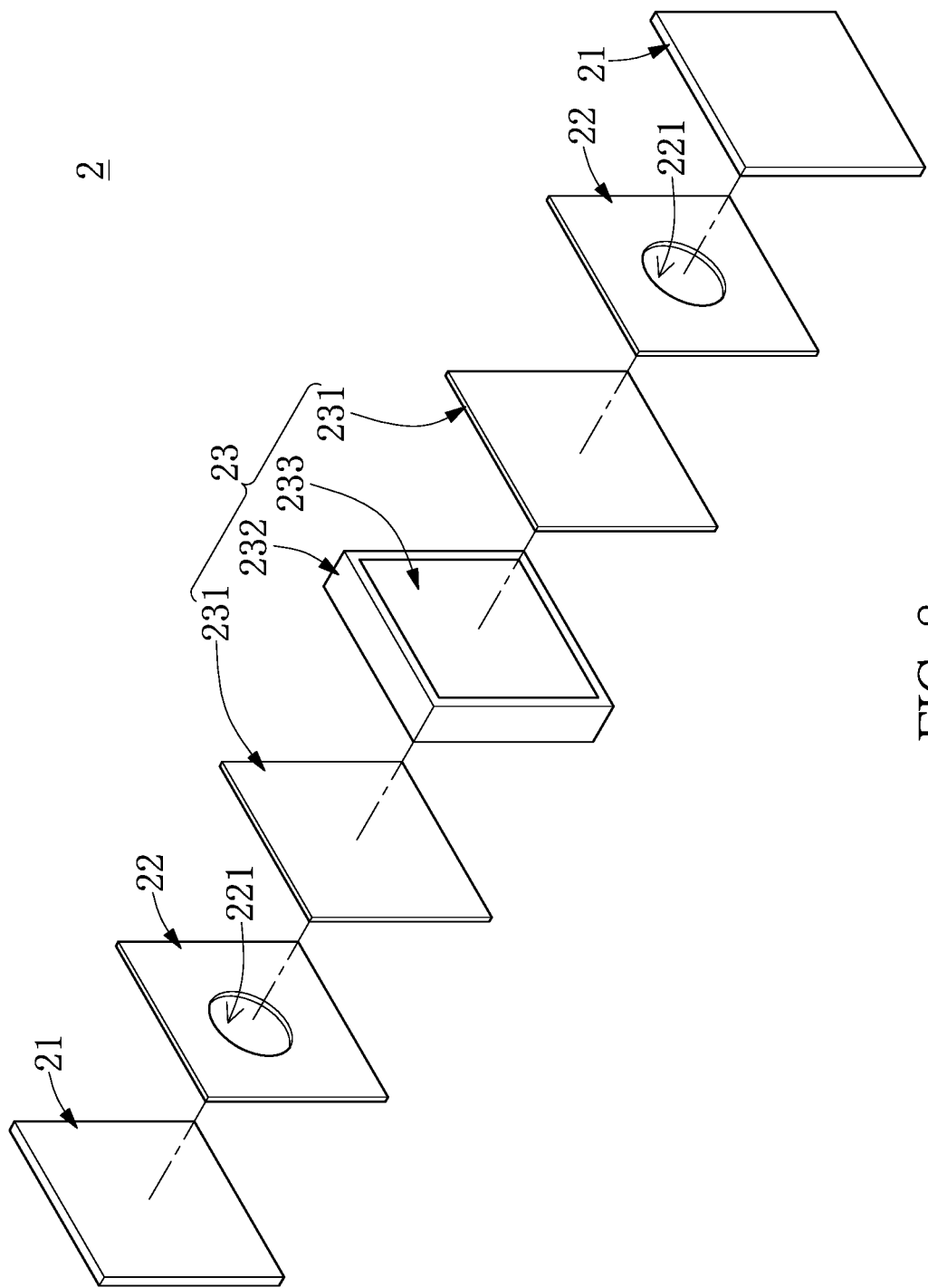
FIG. 8 is an exploded view showing the second LC aperture unit of FIG. 7.
Figure 9:
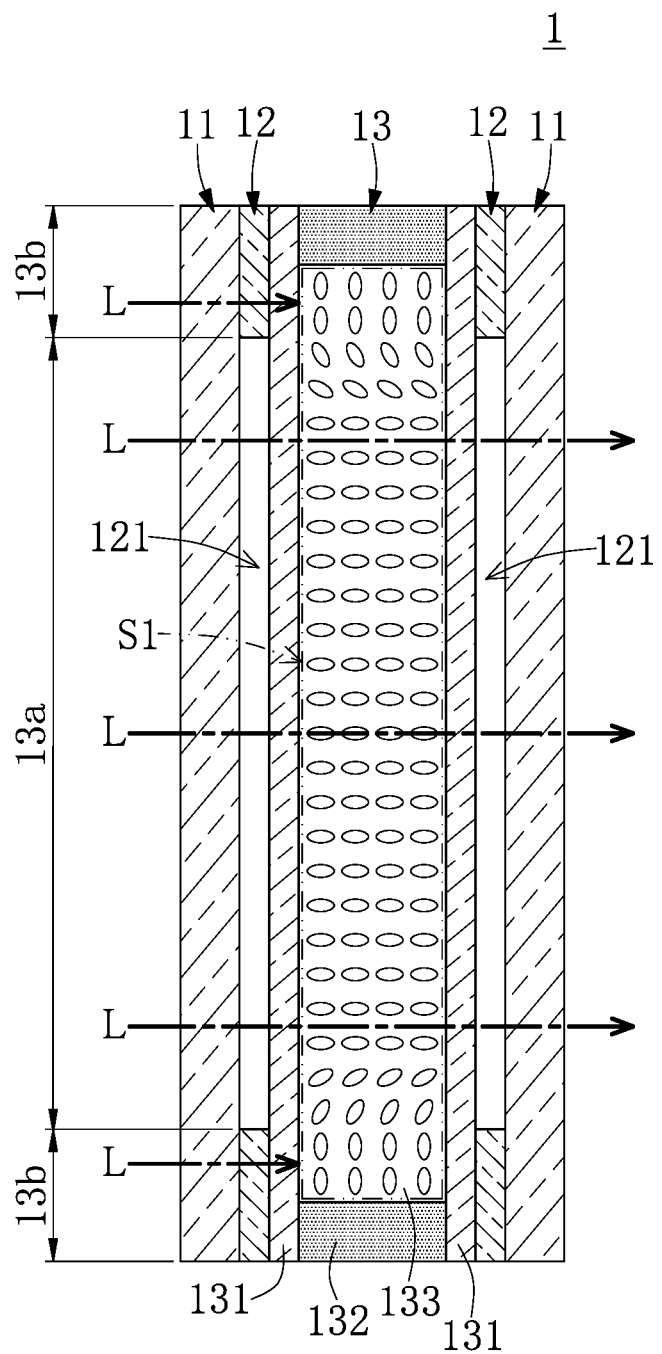
FIG. 9 is a cross-sectional view taken along line IX-IX of FIG. 7.
Figure 10:
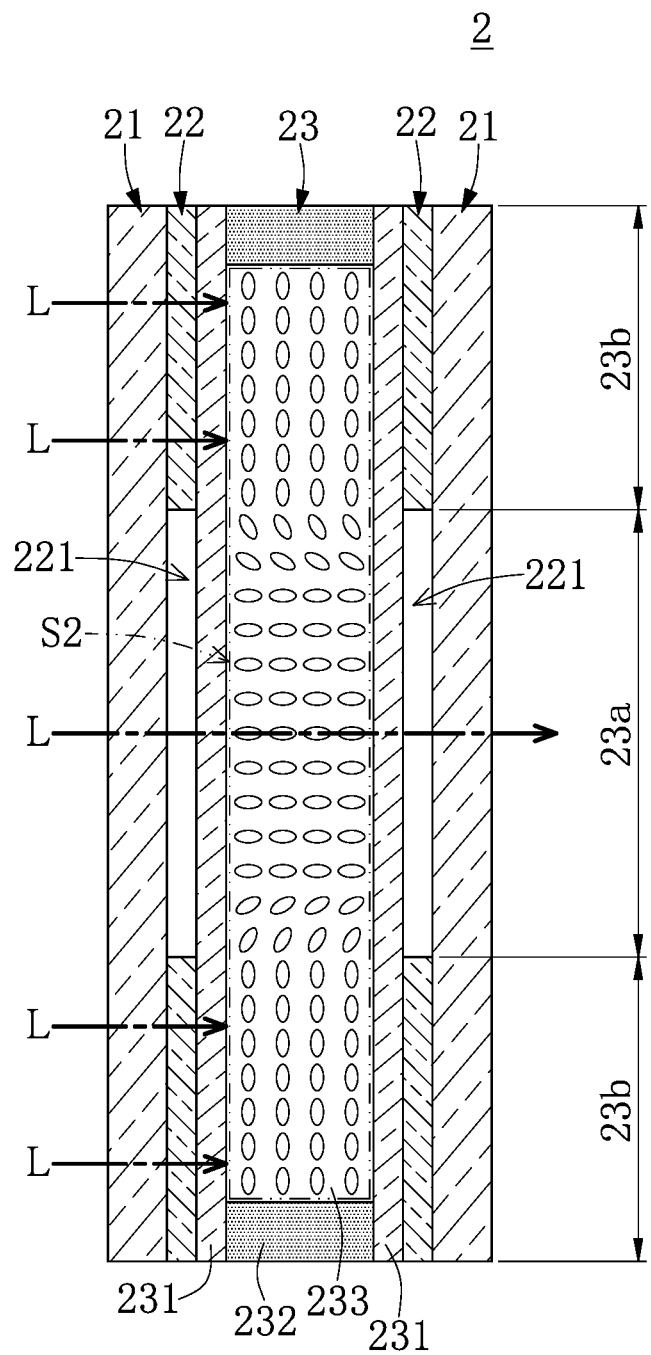
FIG. 10 is a cross-sectional view taken along line X-X of FIG. 7.

Specifically, as shown in FIG. 9, since the structure of the first LC aperture unit 1 of the present embodiment is substantially identical to that of the first embodiment, descriptions of the first LC aperture unit 1 in the present embodiment are omitted for the sake of brevity. As shown in FIG. 8 and FIG. 10, the second LC aperture unit 2 in the present embodiment includes two second transparent substrates 21, two second transparent electrode layers 22 respectively formed on the two second transparent substrates 21, and a second LC layer 23 arranged between the two second transparent electrode layers 22. In other words, the two second transparent electrode layers 22 are respectively disposed on two opposite sides of the second LC layer 23, and each of the two second transparent electrode layers 22 is sandwiched between the second LC layer 23 and the corresponding second transparent substrate 21.

However, in other embodiments of the present disclosure, the first LC aperture unit 1 can be stacked onto the second LC aperture unit 2 through an adhesive layer; or, at least one of the first LC aperture unit 1 and the second LC aperture unit 2 can be arranged between two of the lenses 401 of the lens module 400 adjacent to each other.

Moreover, in other embodiments of the present disclosure, the aperture module 100 can further include at least one independent LC aperture unit that is similar in structure to the second LC aperture unit 2. Specifically, the difference between the at least one LC aperture unit (not shown) and the second LC aperture unit 2 is that an inner diameter of an opening of a transparent electrode of the at least one LC aperture unit (not shown) is different from that of the first opening 121 and different from that of the second opening 221.

Third Embodiment

Referring to FIG. 11 to FIG. 15, a third embodiment of the present disclosure is similar to the first and second embodiments of the present disclosure. For the sake of brevity, descriptions of the same components in the first to third embodiments of the present disclosure will be omitted, and the following description only discloses different features between the third embodiment and the first and second embodiments.

Figure 11:
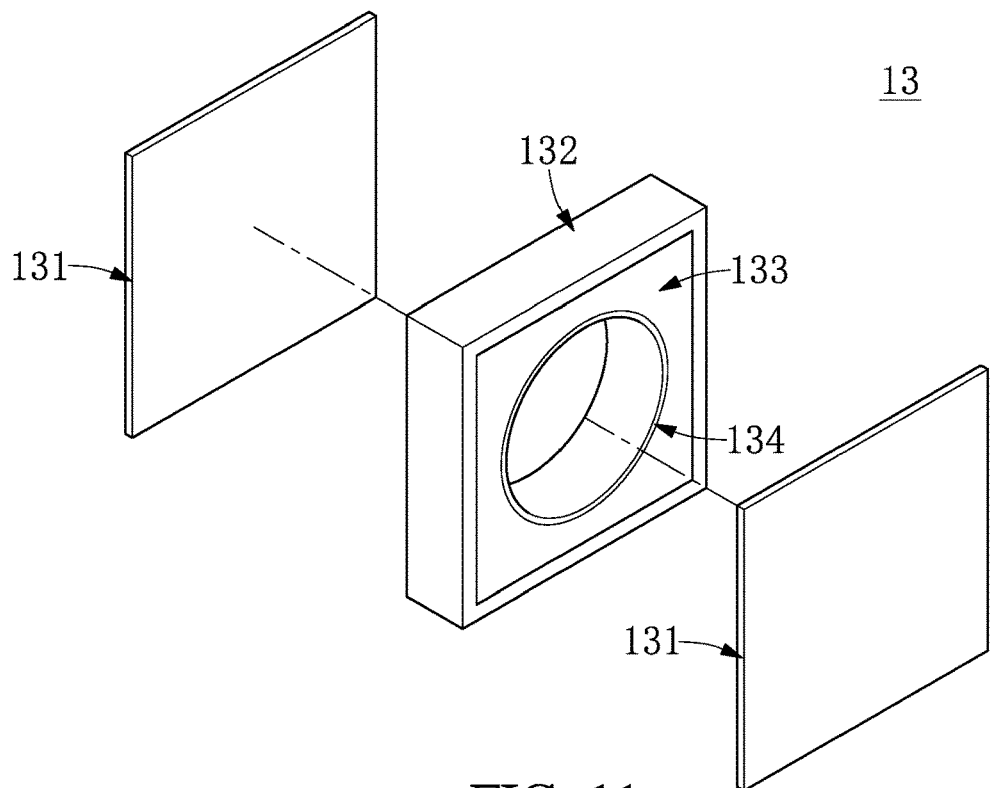
FIG. 11 is an exploded view of a first LC layer according to a third embodiment of the present disclosure.
Figure 13:
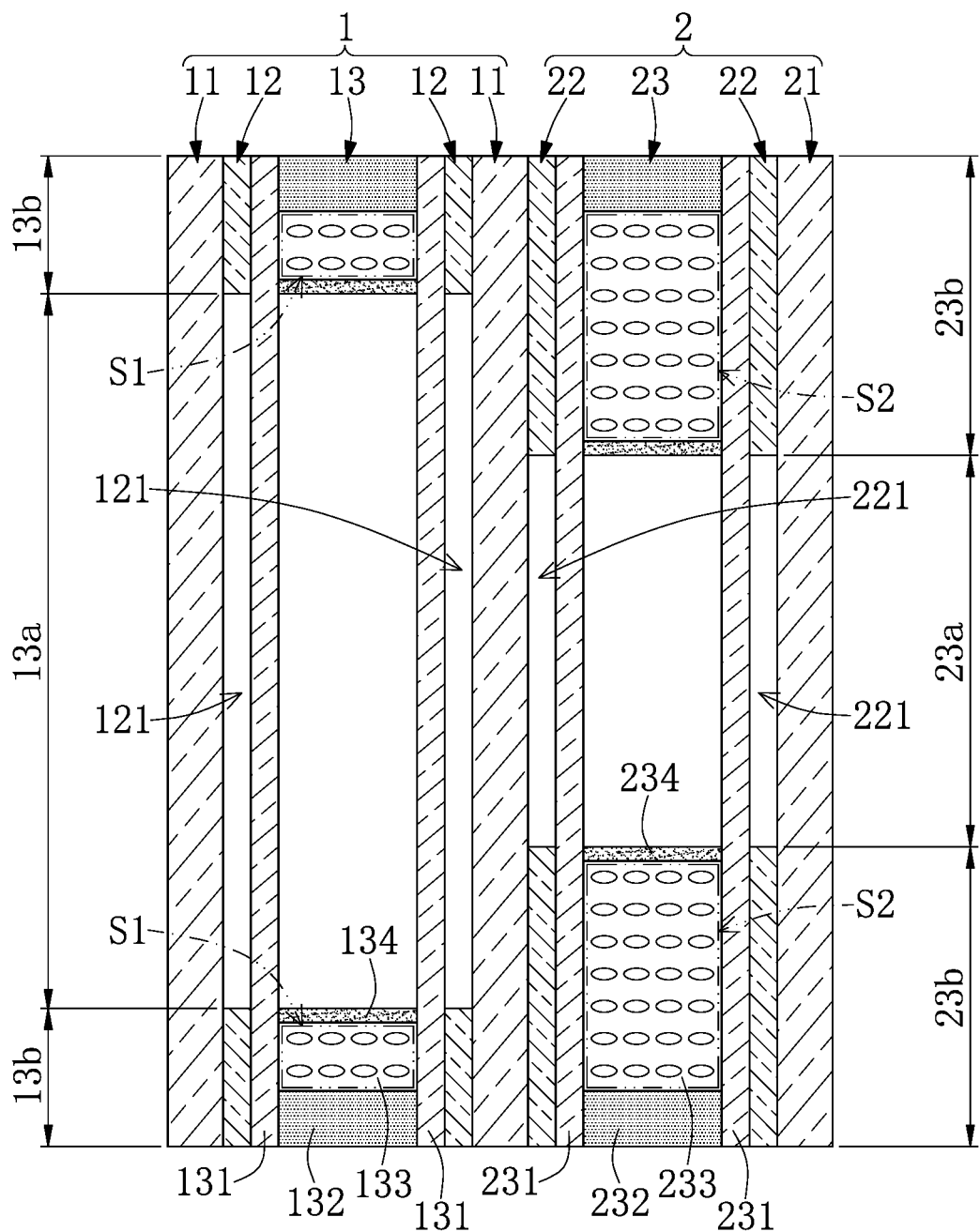
FIG. 13 is a cross-sectional view showing a first LC aperture unit and a second LC aperture unit that is stacked on the first LC aperture unit according to the third embodiment of the present disclosure.
Figure 14:
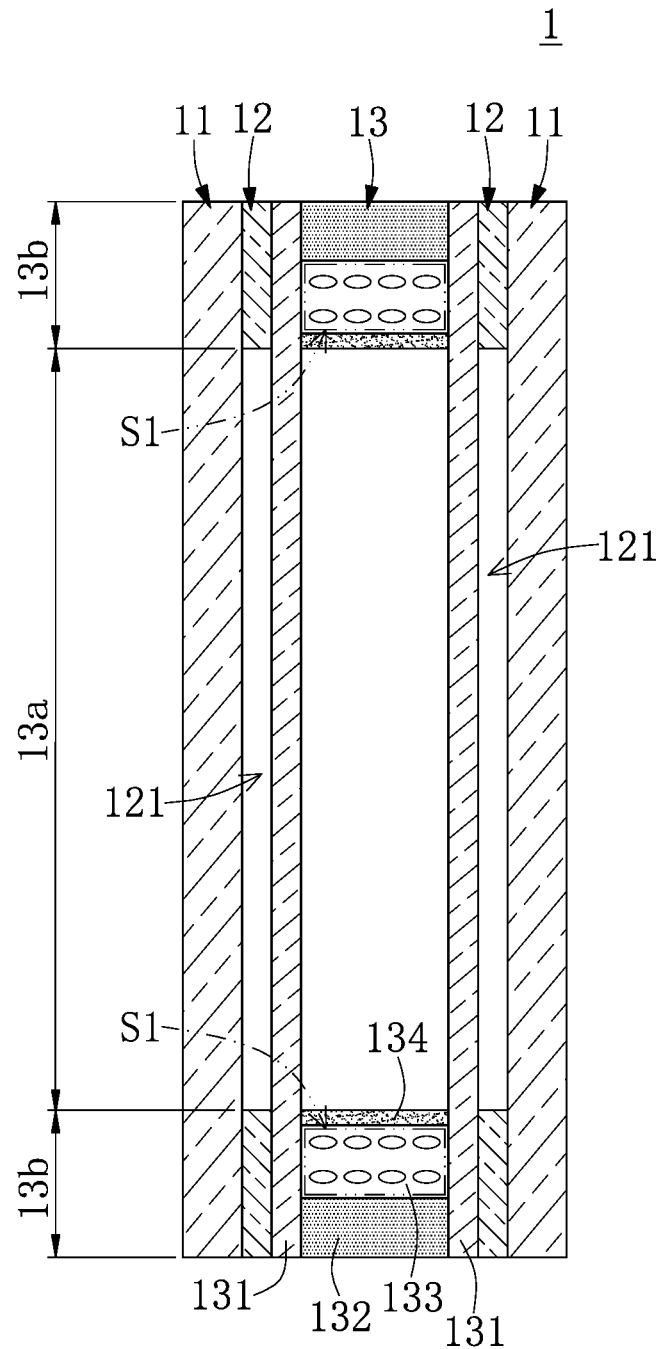
FIG. 14 is a cross-sectional view showing the first LC aperture unit that is provided in an independent configuration according to the third embodiment of the present disclosure.

In the present embodiment, as shown in FIG. 11, FIG. 13, and FIG. 14, the first LC layer 13 includes two first orientation layers 131, an outer ring-shaped adhesive 132 connected to inner surfaces of the two first orientation layers 131, an inner ring-shaped adhesive 134 arranged inside of the outer ring-shaped adhesive 132 and connected to the inner surfaces of the two first orientation layers 131, and a first LC group 133. The inner ring-shaped adhesive 134 corresponds in position to the inner edge of each of the two first transparent electrode layers 12. In other words, the inner ring-shaped adhesive 134 is flush with the inner edge of each of the two first transparent electrode layers 12 along a direction parallel to the optical axis C. Accordingly, the outer ring-shaped adhesive 132, the inner ring-shaped adhesive 134, and the two first orientation layers 131 jointly and surroundingly define a first enclosed space S1, and the first LC group 133 is filled within the first enclosed space S1.

Figure 12:
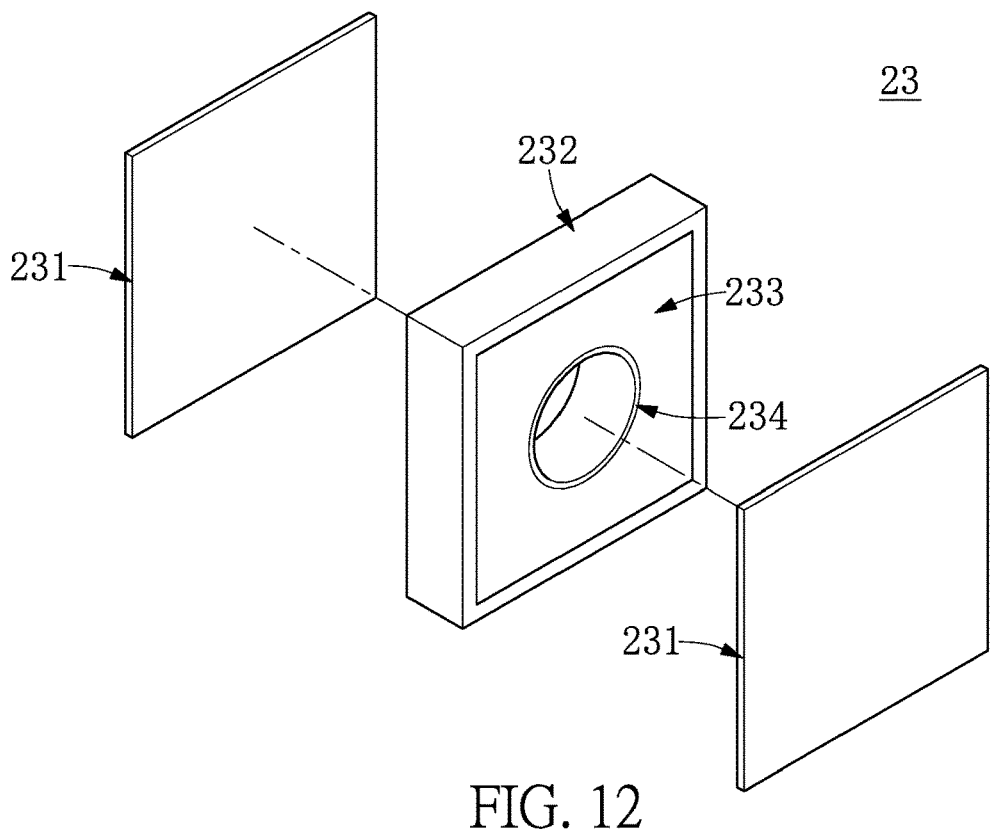
FIG. 12 is an exploded view of a second LC layer according to the third embodiment of the present disclosure.
Figure 15:
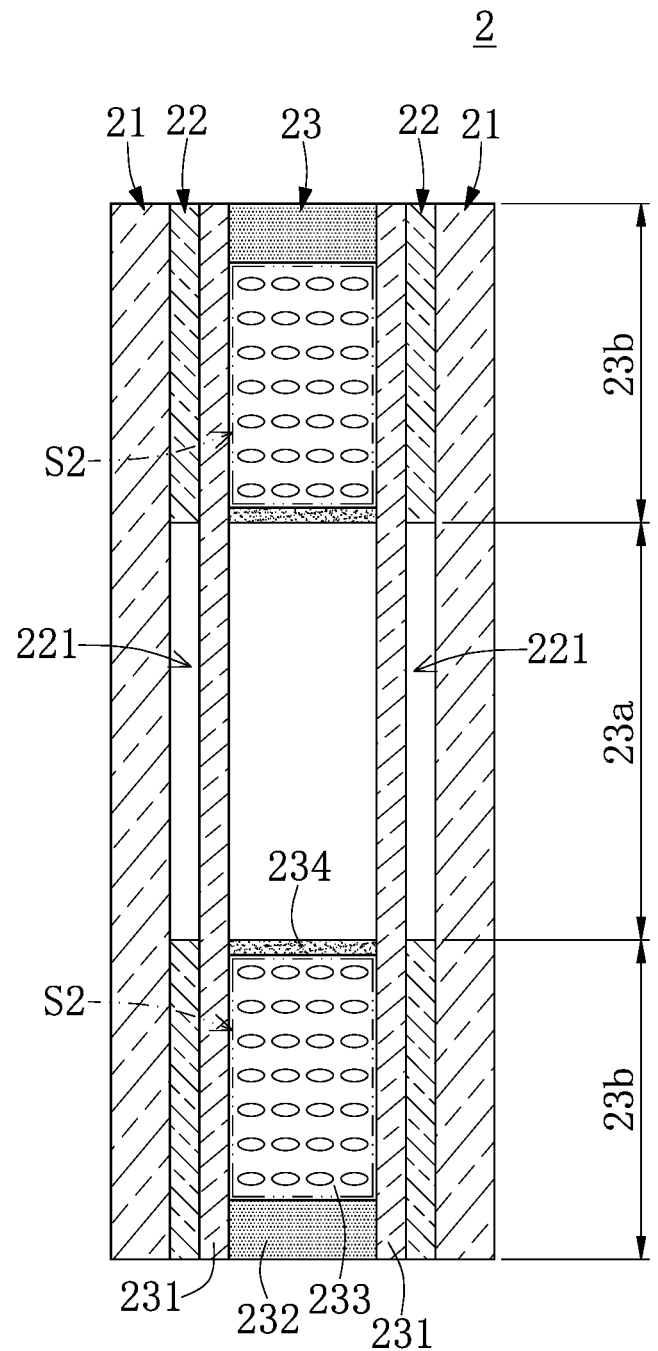
FIG. 15 is a cross-sectional view showing the second LC aperture unit that is provided in an independent configuration according to the third embodiment of the present disclosure.

Moreover, as shown in FIG. 12, FIG. 13, and FIG. 15, the second LC layer 23 in the present embodiment includes two second orientation layers 231, an outer ring-shaped adhesive 232 connected to inner surfaces of the two second orientation layers 231, an inner ring-shaped adhesive 234 arranged inside of the outer ring-shaped adhesive 232 and connected to the inner surfaces of the two second orientation layers 231, and a second LC group 233. The inner ring-shaped adhesive 234 corresponds in position to the inner edge of each of the two second transparent electrode layers 22. In other words, the inner ring-shaped adhesive 234 is flush with the inner edge of each of the two second transparent electrode layers 22 along a direction parallel to the optical axis C. Accordingly, the outer ring-shaped adhesive 232, the inner ring-shaped adhesive 234, and the two second orientation layers 231 jointly and surroundingly define a second enclosed space S2, and the second LC group 233 is filled within the second enclosed space S2.

In summary, as shown in FIG. 11 to FIG. 15, each of the first LC layer 13 and the second LC layer 23 in the present embodiment has the inner ring-shaped adhesive 134, 234, so that the first light permeable region 13a and the second light permeable region 23a can be provided without any LC molecule therein for reducing cost of materials and increasing the transmittance of the first light permeable region 13a and transmittance of the second light permeable region 23a, but the present disclosure is not limited thereto. For example, in other embodiments of the present disclosure, one of the first LC layer 13 and the second LC layer 23 has the inner ring-shaped adhesive, but the other one of the first LC layer 13 and the second LC layer 23 does not have the inner ring-shaped adhesive.

In conclusion, the first LC aperture unit and the second LC aperture unit of the aperture module in the present disclosure can be used in cooperation with the lens module of the mobile communication apparatus for adjusting the aperture value, thereby effectively increasing the photograph performance of the mobile communication apparatus.

Moreover, the second LC aperture unit in the present disclosure can be directly disposed on or formed onto one of the two first transparent substrates of the first LC aperture unit, so that the second LC aperture unit and the first LC aperture unit can share the use of one of the two first transparent substrates. Accordingly, the thickness of the aperture module can be effectively reduced for being applied to the mobile communication apparatus requiring a smaller thickness.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A mobile communication apparatus, comprising:
a display;
an image sensor electrically coupled to the display;
a lens module corresponding in position to the image sensor and defining an optical axis; and
an aperture module arranged at the optical axis of the lens module, wherein the lens module and the aperture module are jointly provided for a light to pass therethrough and project onto the image sensor, so that the image sensor is configured to emit a signal related to the light to be transmitted to the display, and wherein the aperture module includes:
a first liquid crystal (LC) aperture unit including:
a first LC layer having a first light permeable region and a first switch region that surrounds the first light permeable region, wherein a transmittance of the first light permeable region is greater than or equal to a transmittance of the first switch region; and
two first transparent electrode layers respectively disposed on two opposite sides of the first LC layer, wherein an inner side of each of the two first transparent electrode layers surroundingly defines a first opening that corresponds in position to the first light permeable region;
a second LC aperture unit including:
a second LC layer having a second light permeable region and a second switch region that surrounds the second light permeable region, wherein a transmittance of the second light permeable region is greater than or equal to a transmittance of the second switch region; and
two second transparent electrode layers respectively disposed on two opposite sides of the second LC layer, wherein an inner side of each of the two second transparent electrode layers surroundingly defines a second opening that corresponds in position to the second light permeable region, and wherein an inner diameter of each of the first openings is different from an inner diameter of each of the second openings, and a central axis of each of the first openings and a central axis of each of the second openings are overlapped with the optical axis; and a controlling unit electrically coupled to the two first transparent electrode layers and the two second transparent electrode layers so as to control each of the first switch region and the second switch region to be selectively at a light permeable state and a light shield state, wherein the transmittance of any one of the first switch region and the second switch region at the light shield state is less than that at the light permeable state, wherein the aperture module allows at least one of the first switch region and the second switch region to be selectively at the light shield state by the controlling unit, so that the aperture module is configured to provide an aperture value corresponding to the first opening or the second opening, wherein the first LC layer includes:

two first orientation layers, wherein the two first transparent electrode layers are respectively disposed on outer surfaces of the two first orientation layers that are distant from each other;

an outer ring-shaped adhesive connected to inner surfaces of the two first orientation layers; and an inner ring-shaped adhesive arranged at an inner side of the outer ring-shaped adhesive and connected to the inner surfaces of the two first orientation layers, wherein the outer ring-shaped adhesive, the inner ring-shape adhesive, and the two first orientation layers jointly define a first enclosed space, and wherein the inner ring-shaped adhesive corresponds in position to the inner side of each of the two first transparent electrode layers; and a first LC group filled in the enclosed space.

2. The mobile communication apparatus according to claim 1, wherein the first LC aperture unit includes two first transparent substrates, the two first transparent electrode layers are respectively formed on the two first transparent substrates, and each of the first transparent electrode layer is sandwiched between the corresponding first transparent substrate and the first LC layer.

3. The mobile communication apparatus according to claim 2, wherein the second LC aperture unit includes a second transparent substrate, and wherein one of the two second transparent electrode layers is formed on the second transparent substrate and is sandwiched between the second transparent substrate and the second LC layer, and the other one of the two second transparent electrode layers is formed on one of the two first transparent substrates and is sandwiched between the corresponding first transparent substrate and the second LC layer.

4. The mobile communication apparatus according to claim 1, wherein the transmittance of any one of the first switch region and the second switch region at the light shield state is less than 20%.

5. An optical assembly, comprising:

a lens module defining an optical axis; and an aperture module arranged at the optical axis of the lens module, wherein the lens module and the aperture module are jointly provided for a light to pass therethrough, and wherein the aperture module includes:

a first liquid crystal (LC) aperture unit including:

a first LC layer having a first light permeable region and a first switch region that is arranged around the first light permeable region, wherein a transmittance of the first light permeable region is greater than or equal to a transmittance of the first switch region; and two first transparent electrode layers respectively disposed on two opposite sides of the first LC layer, wherein an inner side of at least one of the two first transparent electrode layers surroundingly defines a first opening that corresponds in position to the first light permeable region;

a second LC aperture unit including:

a second LC layer having a second light permeable region and a second switch region that is arranged around the second light permeable region, wherein a transmittance of the second light permeable region is greater than or equal to a transmittance of the second switch region; and two second transparent electrode layers respectively disposed on two opposite sides of the second LC layer, wherein an inner side of at least one of the two second transparent electrode layers surroundingly defines a second opening that corresponds in position to the second light permeable region, and wherein an inner diameter of the first opening is different from an inner diameter of the second opening, and a central axis of the first opening and a central axis of the second opening are overlapped with the optical axis; and a controlling unit electrically coupled to the two first transparent electrode layers and the two second transparent electrode layers so as to control each of the first switch region and the second switch region to be selectively at a light permeable state and a light shield state, wherein the transmittance of any one of the first switch region and the second switch region at the light shield state is less than that at the light permeable state, wherein the aperture module allows at least one of the first switch region and the second switch region to be selectively at the light shield state by the controlling unit, so that the aperture module is configured to provide an aperture value corresponding to the first opening or the second opening;

wherein the first LC layer includes:

two first orientation layers, wherein the two first transparent electrode layers are respectively disposed on outer surfaces of the two first orientation layers that are distant from each other;

an outer ring-shaped adhesive connected to inner surfaces of the two first orientation layers; and an inner ring-shaped adhesive arranged at an inner side of the outer ring-shaped adhesive and connected to the inner surfaces of the two first orientation layers, wherein the outer ring-shaped adhesive, the inner ring-shape adhesive, and the two first orientation layers jointly define a first enclosed space, and wherein the inner ring-shaped adhesive corresponds in position to the inner side of each of the two first transparent electrode layers; and a first LC group filled in the enclosed space.

6. The optical assembly according to claim 5, wherein the transmittance of any one of the first switch region and the second switch region at the light shield state is less than 50%.

7. An aperture module of an optical assembly, comprising:

a first liquid crystal (LC) aperture unit including:

a first LC layer having a first light permeable region and a first switch region that is arranged around the first light permeable region, wherein a transmittance of the first light permeable region is greater than or equal to a transmittance of the first switch region; and two first transparent electrode layers respectively disposed on two opposite sides of the first LC layer, wherein an inner side of at least one of the two first transparent electrode layers surroundingly defines a first opening that corresponds in position to the first light permeable region;

a second LC aperture unit including:
 a second LC layer having a second light permeable region and a second switch region that is arranged around the second light permeable region, wherein a transmittance of the second light permeable region is greater than or equal to a transmittance of the second switch region; and two second transparent electrode layers respectively disposed on two opposite sides of the second LC layer, wherein an inner side of at least one of the two second transparent electrode layers surroundingly defines a second opening that corresponds in position to the second light permeable region, and wherein an inner diameter of the first opening is different from an inner diameter of the second opening, and a central axis of the first opening is overlapped with a central axis of the second opening, wherein the two first transparent electrode layers and the two second transparent electrode layers are configured to electrically couple to a controlling unit so as to control each of the first switch region and the second switch region to be selectively at a light permeable state and a light shield state, and wherein the transmittance of any one of the first switch region and the second switch region at the light shield state is less than that at the light permeable state;

wherein the first LC layer includes:

two first orientation layers, wherein the two first transparent electrode layers are respectively disposed on outer surfaces of the two first orientation layers that are distant from each other;

an outer ring-shaped adhesive connected to inner surfaces of the two first orientation layers; and an inner ring-shaped adhesive arranged at an inner side of the outer ring-shaped adhesive and connected to the inner surfaces of the two first orientation layers, wherein the outer ring-shaped adhesive, the inner ring-shape adhesive, and the two first orientation layers jointly define a first enclosed space, and wherein the inner ring-shaped adhesive corresponds in position to the inner side of each of the two first transparent electrode layers; and a first LC group filled in the enclosed space.

* * * * *